US008634682B1

(12) United States Patent  
Stone

(10) Patent No.: US 8,634,682 B1
(45) Date of Patent: *Jan. 21, 2014

(54) ALIGNMENT TOLERANT OPTICAL INTERCONNECT DEVICES

(75) Inventor: Thomas W. Stone, Hellertown, PA (US)

(73) Assignee: Wavefront Research, Inc., Bethleham, PA (US)

(*) Notice: Subject to any disclaimer, the term of this patent is extended or adjusted under 35 U.S.C. 154(b) by 892 days.

This patent is subject to a terminal disclaimer.

(21) Appl. No.: 12/476,974

(22) Filed: Jun. 2, 2009

Related U.S. Application Data

(63) Continuation-in-part of application No. 12/455,367, filed on Jun. 1, 2009, now Pat. No. 8,378,475.

(60) Provisional application No. 61/058,054, filed on Jun. 2, 2008.

(51) Int. Cl.
G02B 6/36 (2006.01)

(52) U.S. Cl.
USPC ............................................. 385/14; 385/34

(58) Field of Classification Search
USPC .......................................... 385/33, 34, 36, 14
See application file for complete search history.

(56) References Cited

U.S. PATENT DOCUMENTS

| 5,216,278 A | 6/1993 | Lin et al. |
| 6,881,074 B1 | 4/2005 | McLenaghan |
| 6,909,557 B2* | 6/2005 | Kittaka et al. ............... 359/652 |
| 7,015,454 B2* | 3/2006 | Stone ............................ 250/216 |
| 7,178,235 B2 | 2/2007 | Rolston et al. |
| 7,339,278 B2 | 3/2008 | Iksan et al. |
| 8,049,310 B2* | 11/2011 | Wolter et al. ................. 257/621 |
| 8,378,475 B1* | 2/2013 | Veitch et al. .................. 257/686 |
| 2005/0121820 A1 | 6/2005 | Rolston et al. |
| 2007/0069371 A1 | 3/2007 | Iksan et al. |

OTHER PUBLICATIONS

Chowdhury, S. et al., Microelectromechanical systems and system-on-chip connectivity, IEEE Circuits and Systems Magazine, vol. 2, Issue: 2 (2002) pp. 4-28.
Prather, D.W., et al., "An opto-electronic multi-chip module for chip-scale interconnects," Monday Morning, CLEO 2001, CMI2, pp. 40-41 (2001).
Notice of Allowance dated Oct. 15, 2012 for parent U.S. Appl. No. 12/455,367.
Allowed claims for parent U.S. Appl. No. 12/455,367.

* cited by examiner

Primary Examiner — Sarah Hahm
(74) Attorney, Agent, or Firm — Burns & Levinson LLP; Jacob N. Erlich; Orlando Lopez

(57) ABSTRACT

In one configuration of the present teachings, compliant mountings are used to allow for point-to-point optical data pipe (PP-ODP) operation over wide temperature ranges. In another configuration, a long finite conjugate imager is replaced by to infinite conjugate imagers, which allows for enhanced thermal expansion tolerances. Sleeves may be used to further ruggedize the interconnect and to provide further protection from contamination. In addition, long-range capability spanning multiple boards can be achieved by the pres set of ODP configurations of these teachings that utilize edge-mounted ODP modules in PP-ODP, BB-ODP, and ODP Bus forms.

11 Claims, 12 Drawing Sheets

ALIGNMENT TOLERANT OPTICAL INTERCONNECT DEVICES

CROSS REFERENCE TO RELATED APPLICATIONS

This application claims priority to U.S. Provisional Application Ser. No. 61/058,054, filed Jun. 2, 2008, entitled ALIGNMENT TOLERANT OPTICAL INTERCONNECT DEVICES, and is a continuation-in-part of co-pending U.S. application Ser. No. 12/455,367, filed Jun. 1, 2009 and entitled Optoelectronic Chip Carriers, which claims priority to U.S. Provisional Application Ser. No. 61/057,587, filed May 30, 2008, all of which are incorporated herein by reference in their entirety.

STATEMENT OF FEDERALLY SPONSORED RESEARCH OR DEVELOPMENT

This invention was made in part with U.S. Government support from the U.S. Air Force under contract #F30602-03-C-0213 and from the U.S. Air Force under contract #FA8750-04-C-0250. The U.S. Government has certain rights in the invention.

BACKGROUND

These teachings relate generally to optical interconnects, and, more particularly to relaxed tolerance optical interconnects that are effective over chip, module, board, and multiple board distances.

In the optical interconnect system or optical data pipe approach of U.S. Pat. No. 7,015,454, mating emitter and detector arrays are pre-aligned and fixed on or near the ends of a gradient index rod imager, and this flexible pre-aligned structure is then mounted to the host. Using this technology hundreds or thousands of high bandwidth channels can be interconnected for short distances (intra-die, between neighboring chips or MCMS) or over relatively long distances (full board wrap-around, board-to-board, computer to peripheral, computer to computer, etc.). The optical interconnect system of U.S. Pat. No. 7,015,454 provides a nearly lossless one-to-one optical interconnection from a set of input channels to a set of output channels, and supports extreme density, low power, and low crosstalk for high bandwidth signals.

The system of U.S. Pat. No. 7,015,454 can be pre-aligned and fixed during manufacture (e.g., using automated alignment and cementing procedures) to produce optical interconnects that have relaxed alignment tolerances and are thus readily usable in the field by non-optical personnel. The interconnection systems of U.S. Pat. No. 7,015,454 are tolerant of handling, bending and displacements among interconnected components without losing their function of interconnecting many closely packed (dense) optical channels.

However, thermal effects may induce misalignment in the systems disclosed in U.S. Pat. No. 7,015,454.

SUMMARY

The present teachings improve optical data pipe technology as described in detail in U.S. Pat. No. 7,015,454, which is incorporated herein by reference in its entirety, and related cases. by improving performance of point-to-point optical data pipes In one such configuration of the present teachings, compliant mountings are used to allow for point-to-point optical data pipe (PP-ODP) operation over wide temperature ranges.

In another configuration of the present teachings a long finite conjugate imager is replaced by to infinite conjugate imagers, which allows for enhanced thermal expansion tolerances. Sleeves may be used to further ruggedize the interconnect and to provide further protection from contamination.

In addition, long-range capability spanning multiple boards can be achieved by a new set of ODP configurations which utilize edge-mounted ODP modules in PP-ODP, BB-ODP, and ODP Bus forms. Some of these configurations use cascaded ODP modules or ODP modules linked simultaneously using beamsplitters. These modules do not require vias to skip boards since they connect over the edges of the boards.

For a better understanding of the present teachings, together with other and further objects thereof, reference is made to the following description taken in conjunction with the accompanying drawings, and its scope will be pointed out in the appended claims.

DETAILED DESCRIPTION

Low footprint packaged devices such as these are important for optoelectronic device applications, such as the Optical Data Pipe technology disclosed in U.S. Pat. No. 7,015,454, because novel packaging is required to deliver the tiny footprint potential of such technologies. The optical data pipe technology is described further in detail in U.S. Pat. No. 7,015,454, which is incorporated by reference in its entirety herein, and related cases.

Figure 1:
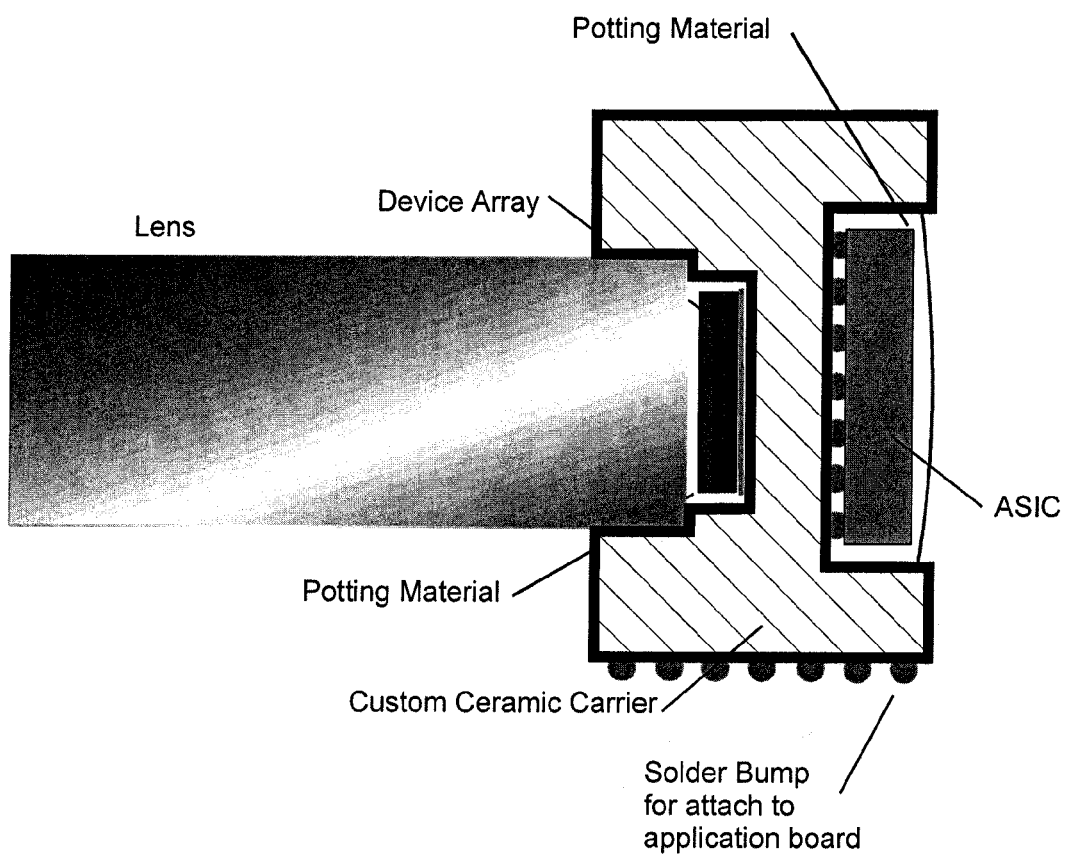
FIG. 1 depicts a schematic of an embodiment of the system of these teachings.

For some BB-ODP applications, it is helpful to interconnect parallel to the circuit board surface rather than perpendicular to it. For these applications, a right-angle ceramic carrier can be a tremendous help. One such embodiment is illustrated in FIG. 1, where one-half of an OPD module pair is shown. The solder bumped carrier maintains a very small footprint, ideally on the order of the footprint of the lens cross-section alone. This interconnect uses a small footprint carrier that the subject of a co-pending provisional patent application titled OPTOELECTRONIC CHIP CARRIERS, Ser. No. 61/057,587, which is incorporated by reference in its entirety herein.

Figure 2:
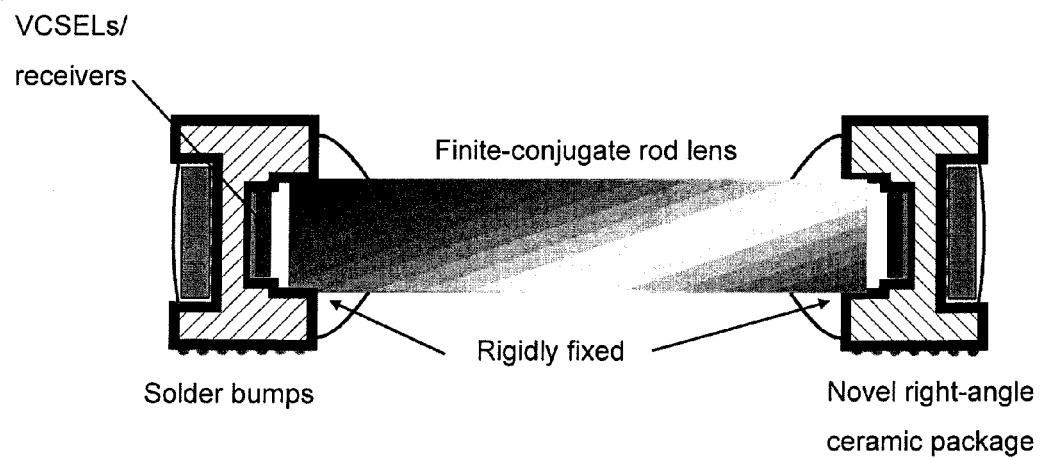
FIG. 2 depicts a schematic of a module of an embodiment of the system of these teachings.

The small footprint carrier is the subject of a companion provisional patent application titled OPTOELECTRONIC CHIP CARRIERS, Ser. No. 61/057,587, and can be applied to ODP modules as shown in FIG. 1, and to other advanced ODP devices as described below. One such Point-to-Point ODP module is illustrated in FIG. 2. Here the finite conjugate rod lens is designed to have a thermal expansion coefficient that matches that of the supporting circuit board host. This relieves stress on the interface between the carrier and the circuit board.

The PP-ODP configuration of FIG. 2 is useful for short and longer range point-to-point interconnection. An example of the latter case for SIMD applications is the SIMD array wraparound from one side of the circuit board to another. Thermal expansion due to temperature fluctuations in the dormant and operating processors can put excessive pressure on the interface between the ODP and the host circuit board (e.g., solder bump bonds). This may be addressed in several ways. In one configuration of the present teachings, shown in FIG. 2, the finite conjugate imager is designed to have a nearly identical thermal expansion coefficient to that of the supporting circuit board. In this relative-athermalization embodiment the temperature may vary over wide excursions without inducing extreme stresses between the optical data pipe and the supporting circuit board or between the imager and the carrier. In addition to matching the thermal expansion coefficients of the imager on the circuit board it is desirable to athermalize the optical performance of the imager as well. By athermalize the imager it is meant that as the imager's optical properties very with temperature, acceptable imaging is maintained from the emitters to the detectors as the locations of the conjugate emitter/detector planes also vary with temperature. (Conventional optical athermalization procedures can be utilized.)

The right angle optoelectronic chip carrier shown in FIGS. 1 and 2 can also be fabricated according to the present teachings to provide for other angles, substantially inclined but at other than right angles between the die mounting surface and the board mounting surface. For example, the die mounting surface may subtend 45 degrees with respect to the board mounting surface, allowing for the optical axis of an included lens or ancillary optical system to travel away from the board or primary wiring surface at an oblique angle. For the purposes of these teachings, substantially perpendicular include optoelectronic chip carrier in which the die mounting surface is inclined with respect to the board mounting surface at angles other than right angle. Inclined as used herein does not include embodiments in which the die mounting surface is substantially parallel to the board mounting surface.

Figure 3:
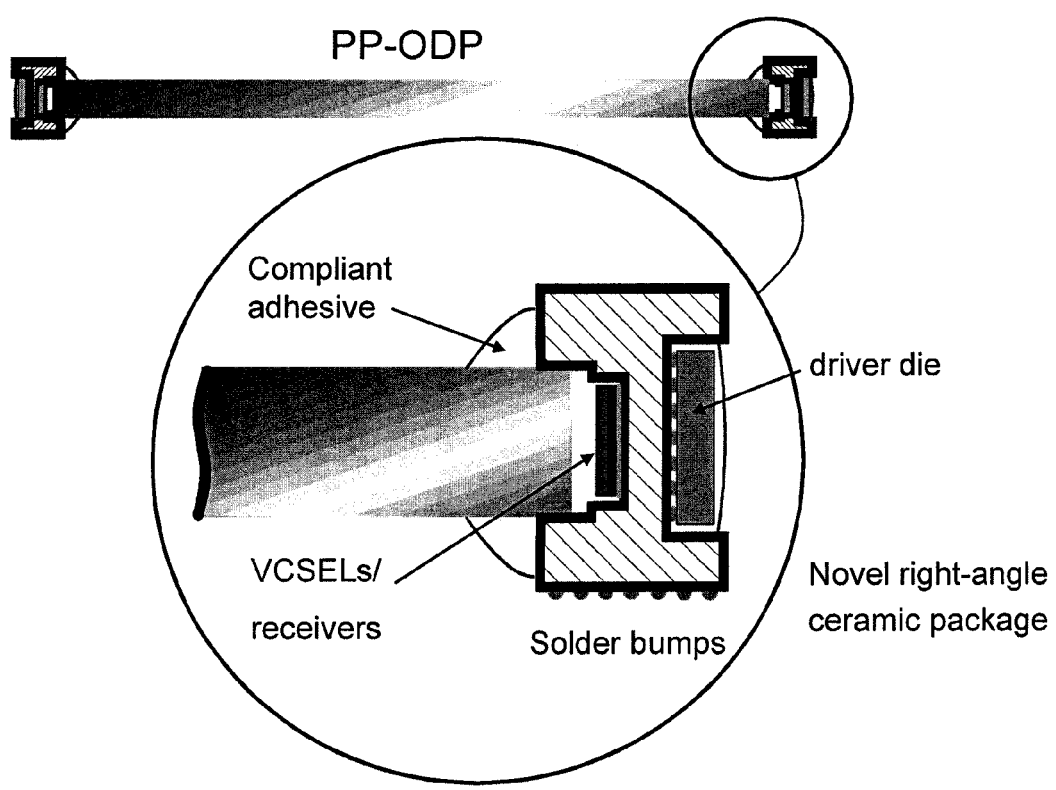
FIG. 3 depicts a schematic of another configuration of an embodiment of the system of these teachings.

Another configuration of the current teachings is Illustrated in FIG. 3. Here the finite conjugate imager, a rod lens in this case, is located in slip channels in the carriers and the use of a compliant adhesive (such as RTV, flexible rubber and silicone adhesives, or compliant optomechanical mounts, etc.) allows tension and compression resulting from small rod length dimensional changes to be relieved. In this configuration, it is not necessary to closely match the thermal expansion coefficients of the imager and the host circuit board because of the compliant adhesive. It is also desirable to athermalize the imager so that the image conjugates are maintained on the VCSELs and Receivers as the compliant adhesive deforms to accommodate the effects of thermal expansion of the imager and host circuit board. This compliant point-to-point optical data pipe (PP-ODP) structure is illustrated in FIG. 3.

A still further embodiment to render the PP-ODP insensitive to thermal expansion stresses is to replace the single long finite conjugate rod lens of the PP-ODP with a pair of infinite conjugate rod lenses (i.e., essentially cutting the finite conjugate rod lens near a collimating pitch length) and optionally inserting a sleeve over the rods. This sleeve may be desirable in some applications in any case for mechanical reasons, and may also offer additional contamination resistance/tolerance. This embodiment is illustrated in FIGS. 4 and 5.

Figure 4:
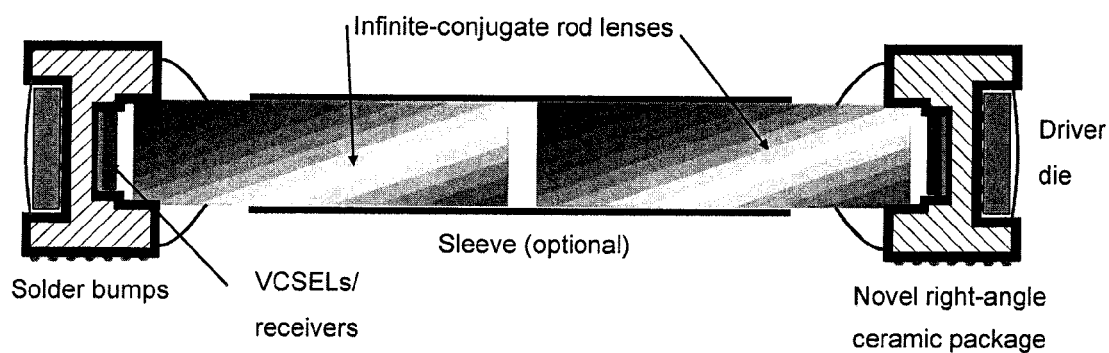
FIG. 4 depicts a schematic of another configuration of an embodiment of the system of these teachings.
Figure 5:
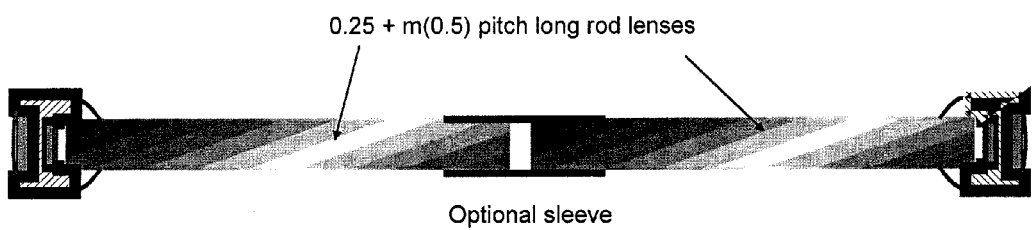
FIG. 5 depicts a schematic of another configuration of an embodiment of the system of these teachings.

In the configuration of the present teachings shown in FIG. 4, two symmetric infinite conjugate imagers (for example, the rod lenses shown) are used to image each of the VCSEL/receiver optoelectronic arrays at infinity in the gap region.

Individual rod lenses with long pitch lengths (reaches) are available. These include pitches on the order of a foot, for example. If longer reaches are desired for the PP-ODP, multiple pitch lengths can be used. For long imagers, the impact of the thermal expansion of the rod lenses can be exacerbated and the sleeved infinite conjugate form is particularly appropriate. In such a case, the PP-ODP infinite conjugate rod lenses are each selected with pitch lengths of 0.25+integral multiples of −0.5 pitch lengths. This is illustrated in FIG. 5.

Figure 6:
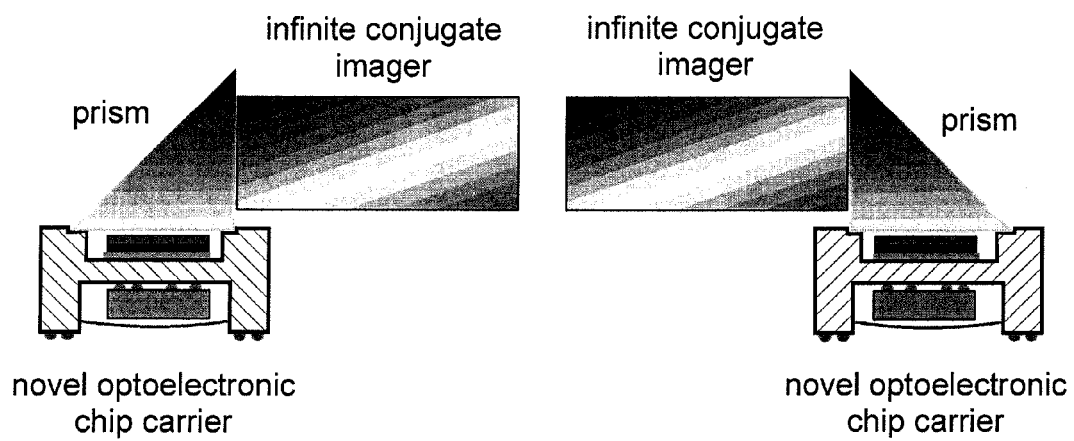
FIG. 6 depicts a schematic of another configuration of an embodiment of the system of these teachings.
Figure 7A:
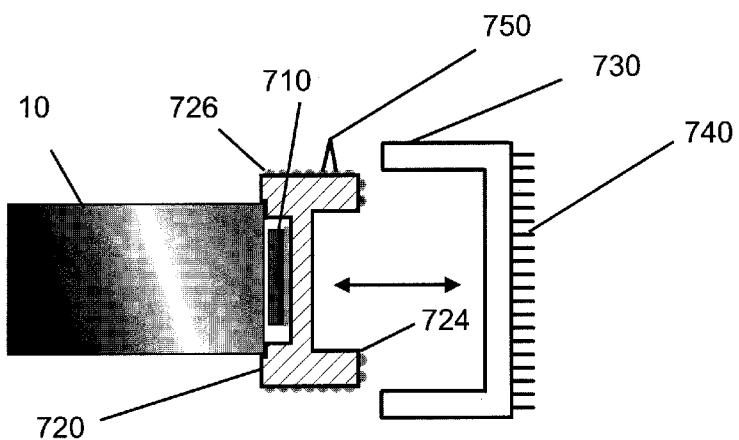
FIG. 7 depicts a cross-sectional view of an embodiment of the system of these teachings.
Figure 7B:
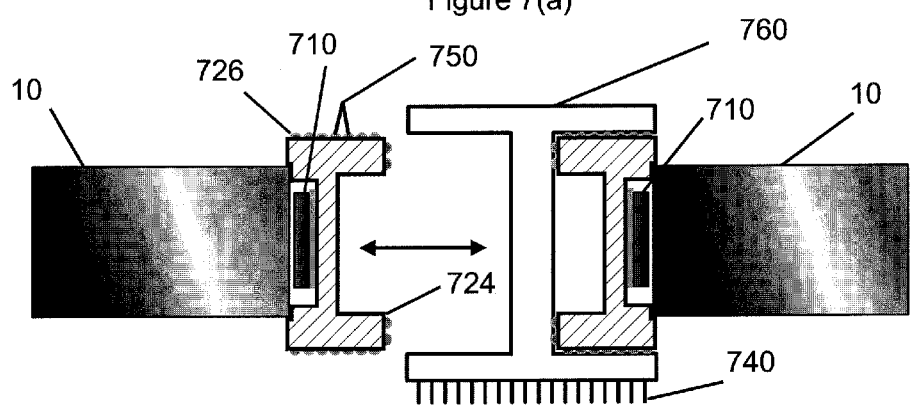
Figure 7C:
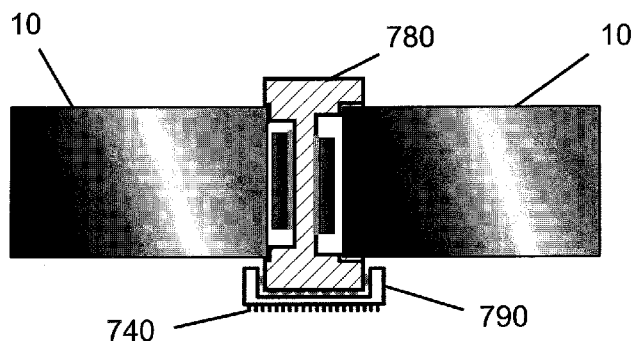
Figure 7D:
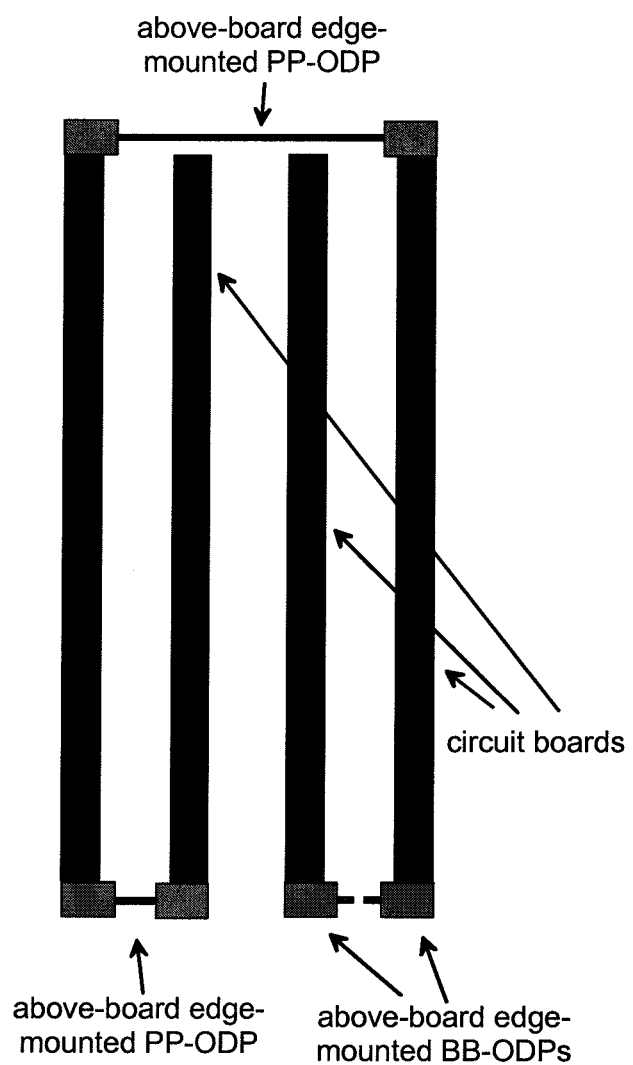

A Right Angle Optical Data Pipe configuration is shown in FIG. 6. This configuration makes use of the novel Optoelectronic Chip Carrier and an infinite conjugate imager that is optimized to image a VCSEL/detector optoelectronic device array through the prism to infinity. A pair of such modules can be used together to interconnect from module to module, point-to-point, board-to-board, board-to-backplane, etc.

A further set of embodiments of the present teachings is described below and provides for a long reach interconnection of multiple boards. In the new embodiments point-to-point, board-to-board, long reach wraparound, and optical data pipe-bus configurations are formed by incorporating the appropriate optical data type modules on the edges of circuit boards. Each of the ODP modules in the configurations below contain an optoelectronic device array and imager, as well as optional beam steering and splitting devices as described in other ODP embodiments in related patents and applications. Extending the ODP modules beyond the board edge provides for the short and long imagers to extend beyond circuit board faces without intersecting the boards or requiring vias. Above-board edge mounted board-to-board optical data pipe and point-to-point optical data pipe configurations are shown in FIG. 7. The optical data pipe example at the top of the Figure demonstrates long-range board wraparound.

Figure 8:
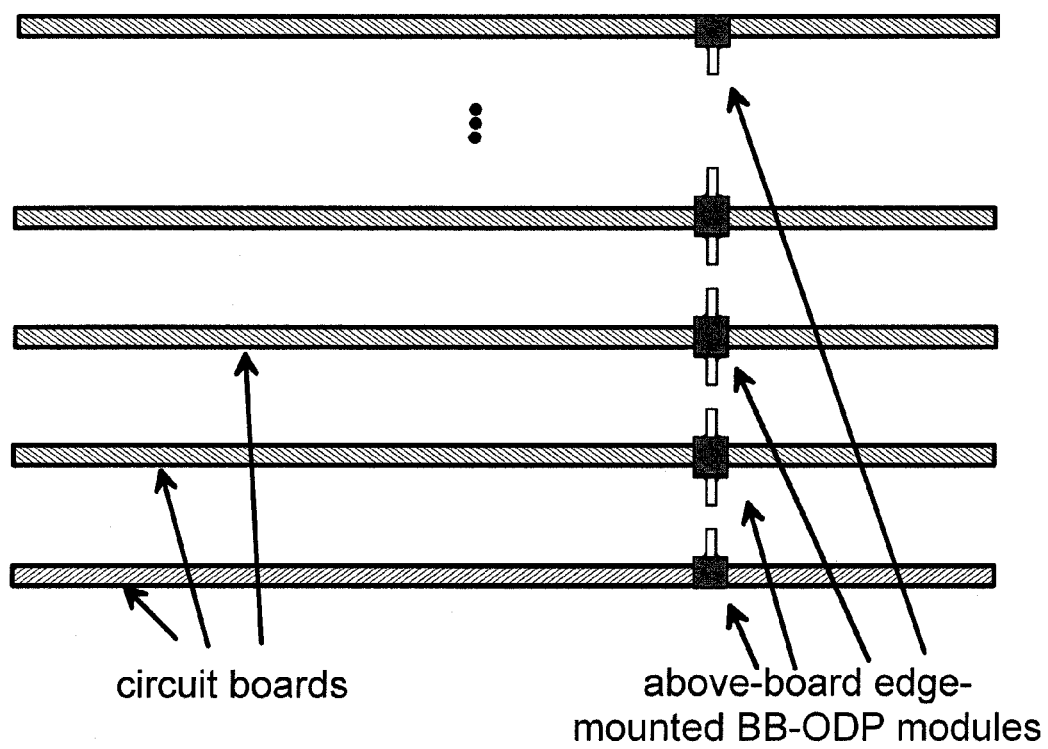
FIG. 8 depicts an aerial view of an embodiment of the system of these teachings.

These above-board modules can be implemented with sockets to make the devices readily removable, and can take advantage of right angle imager devices, right angle carrier devices, or other right angle optical data pipe techniques described in co-pending patent applications and disclosures, such as U.S. patent application Ser. No. 11/385,449, which is incorporated by reference in its entirety herein. The alignment tolerances which are generally relaxed in all six degrees of freedom using optical data pipe technology allow for generous board placement, wiggle, vibration, and misalignment tolerances. An aerial view of Above-Board Edge Mounted Board-To-Board Optical Data Pipe Modules Is Illustrated in FIG. 8.

Figure 9:
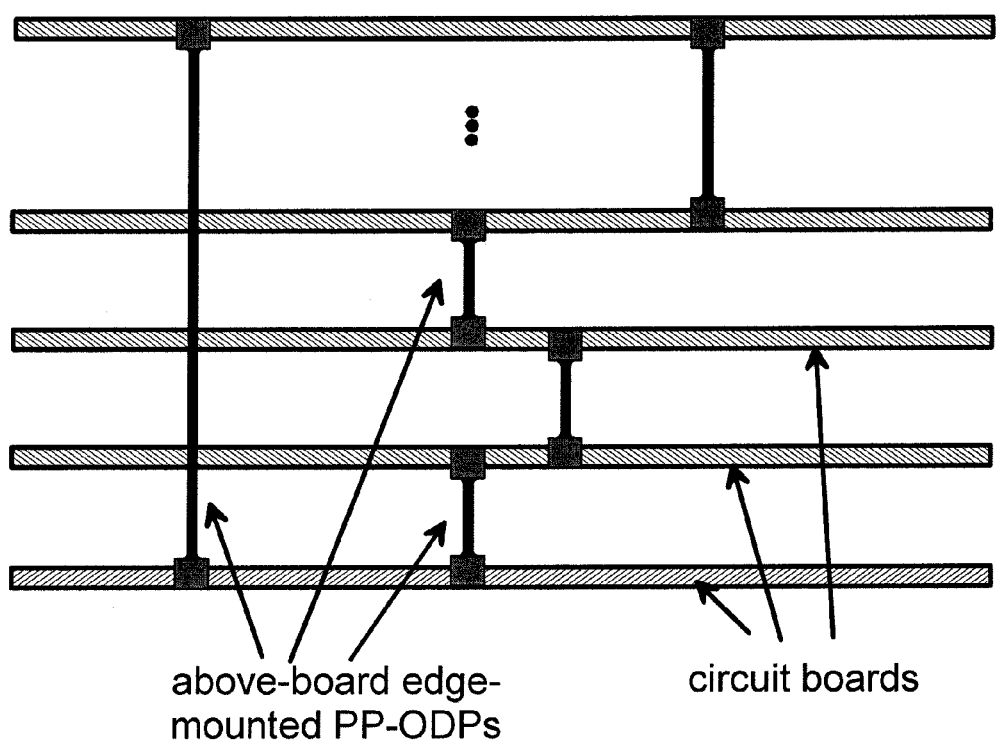
FIG. 9 depicts an aerial view of another embodiment of the system of these teachings.

These ODPs allow each board to talk with its neighbor in an "optical plenum" across an edge. An aerial View of Above-Board Edge Mounted Point-To-Point Optical Data Pipes, Including Long-Reach Wraparound version, shown in FIG. 9.

The Above-Board Edge Mounted Point-To-Point Optical Data Pipes can be arranged to interconnect any set of boards. For example, each board may be interconnected to every other board, or each board may be interconnected to every second, fourth, eighth, $16^{th}$ board, etc. in a hypercube configuration. The Long Reach Wraparound version is shown at left of FIG. 9, where the two end boards are interconnected.

For SIMD processor architectures, this allows the nearest neighbor board-to-board interconnection topology to be closed from one end of the board assembly to the other.

Figure 10:
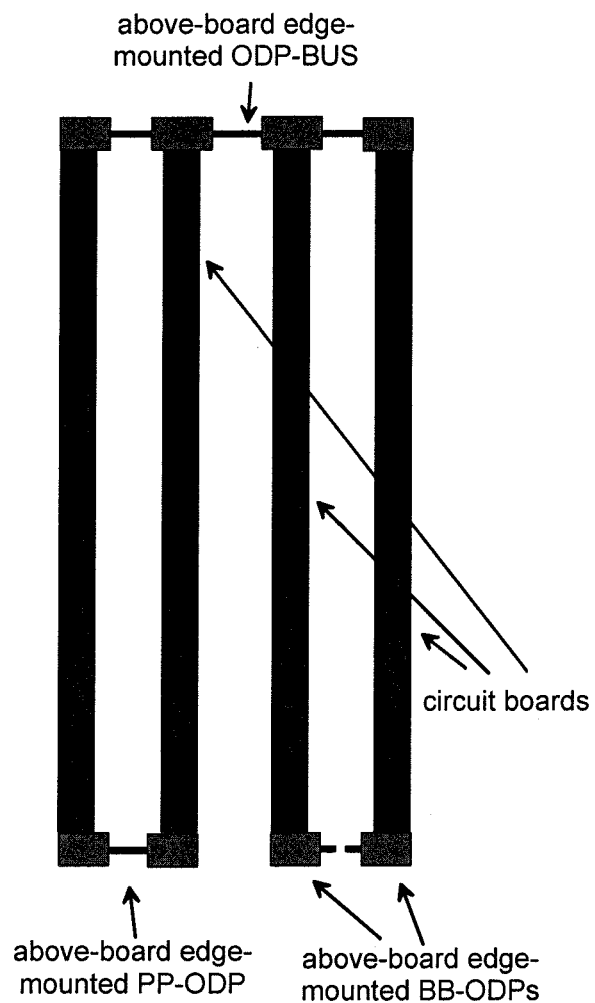
FIG. 10 depicts a cross-sectional view of another embodiment of the system of these teachings.

A cross-section view of an Above-Board Edge Mounted Optical Data Pipe-Bus Optical Interconnect Device is shown at the top of FIG. 10. The signals traveling down the bus can be regenerated at each board, or alternatively can be broadcast simultaneously to all boards with local receive, broadcast, or add/drop accomplished using beamsplitters, partially silvered mirrors, dielectric beamsplitter cubes, etc.

Figure 11:
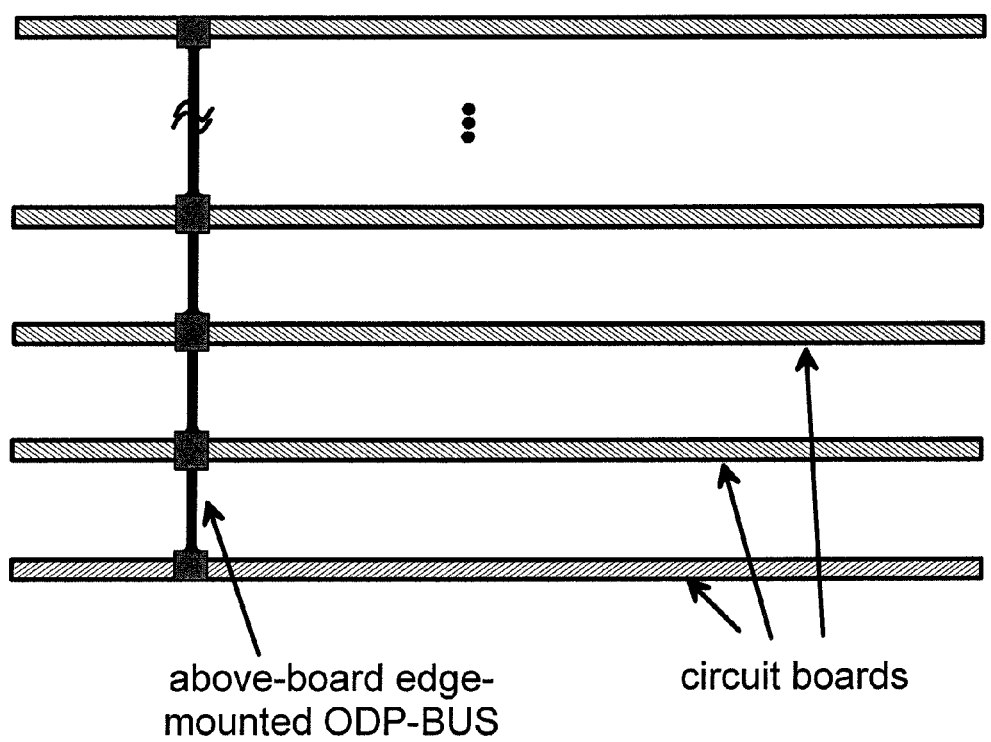
FIG. 11 depicts an aerial view of another embodiment of the system of these teachings.

Similarly the bus can be controlled by a master, or used in other parallel, serial, or array of serial bus configurations. Alternatively, specific channels can be made to propagate to specific boards. An aerial view of the Above-Board Edge Mounted Optical Data Pipe-Bus Optical Interconnect Device is shown in FIG. 11.

Although the teachings have been described with respect to various embodiments, it should be realized these teachings is also capable of a wide variety of further and other embodiments within the spirit and scope of the appended claims.

What is claimed is:

1. A device comprising:
    an optoelectronic component;
    a carrier component comprising:
        an optoelectronic component die mounting surface; said optoelectronic component mounted on said optoelectronic component die mounting surface and electrically attached to at least some of a plurality of conductor contact locations disposed on said optoelectronic component mounting surface;
        a package mounting surface substantially inclined to said optoelectronic component mounting surface;
        a plurality of components for external connection disposed on said package mounting surface;
        said optoelectronic component electrically connected to at least some of said plurality of components for external connection by means of a plurality of conductive circuits path disposed between said optoelectronic component die mounting surface and said first package mounting surface;
        at least some of said plurality of components for external connection being operatively attached to at least one circuit board; and
        an optical component mounting fixture;
    an optical component mounted onto said optical component mounting fixture and being optically disposed to receive/send electromagnetic radiation from/to said optoelectronic component; and
        means for ameliorating effects of thermal expansion of said device and said optical component.

2. The device of claim 1 wherein said optical component comprises materials having a thermal expansion coefficient selected to substantially compensate for movements due to thermal expansion of said at least one circuit board; said materials comprising said optical component constituting said means for ameliorating effects of thermal expansion.

3. The device of claim 1 wherein a compliant adhesive is disposed between said one end of said optical component and said optical component mounting fixture; said compliant adhesive operatively attaching said one end of said optical component to said optical component mounting fixture; said compliant adhesive configured to deform to accommodate effects of thermal expansion of the at least one circuit board and constituting said means for ameliorating effects of thermal expansion.

4. The device of claim 1 further comprising another carrier component having at least another optical mounting fixture; said optical component comprises a pair of infinite conjugate rod lenses; one end of each of the infinite conjugate rod lenses being operatively attached to each said optical component mounting fixture, respectively, another end of each of said pair of infinite conjugate rod lenses being optically disposed to send/receive electromagnetic radiation; said pair of infinite conjugate rod lenses constituting said means for ameliorating effects of thermal expansion.

5. The device of claim 4 further comprising:
    a sleeve at least partially disposed over a portion of each of said pair of infinite conjugate rod lenses.

6. The device according to claim 1, wherein the incline is substantially perpendicular.

7. A method for rendering operation of an optical interconnect resilient to effects of temperature variations, the method comprising the steps of:
    mounting and electrically attaching an optoelectronic component on the optoelectronic component mounting surface of a carrier component; the carrier component having an optoelectronic component mounting surthce having a number of electrical contact locations, a package mounting surface substantially inclined to the optoelectronic component mounting surface, the package mounting surface having a number of components for electrical external connection, a number of conductive circuits paths between the optoelectronic component mounting suffice and the package mounting surface, the conductive circuits paths providing electrical connection between the electrical contact locations and the components for electrical external connection, and an optical component mounting fixture;
    mounting an optical component, one end of the optical component being mounted on to the optical component mounting fixture of the carrier component and another end of the optical component being mounted onto a optical component mounting fixture of another carrier component; and
    ameliorating effects of thermal expansion of at least one circuit board; wherein steps for ameliorating effects of thermal expansion are selected from at least one of selecting materials having a thermal expansion coefficient selected to substantially compensate for movements due to thermal expansion of said at least one circuit board and disposing a compliant adhesive between said one end of said optical component and the optical component mounting fixture of said carrier component
    at least some of the number of components for external connection of the carrier component being operatively attached to said at least one circuit hoard.

8. The method of claim 7 further comprising the step of:
    athermalizing optical performance of the optical component.

9. The method of claim 7 wherein the step of ameliorating effects of thermal expansion comprises a step of:
    selecting materials for the optical component, the selected materials having a thermal expansion coefficient selected to substantially compensate for movements due to thermal expansion of said at least one circuit board.

10. The method of claim 7 wherein the step of ameliorating effects of thermal expansion comprises a step of:
    disposing a compliant adhesive between said one end of said optical component and the optical component mounting fixture of said carrier component; the compliant adhesive operatively attaching said one end of said optical component to the optical component mounting fixture of said carrier component; said compliant adhesive configured to deform to accommodate effects of thermal expansion of the at least one circuit board.

11. The method according to claim 7, wherein the incline is substantially perpendicular.

\* \* \* \* \*